United States Patent [19]
Lindsey, Jr. et al.

[11] Patent Number: 6,022,807
[45] Date of Patent: Feb. 8, 2000

[54] METHOD FOR FABRICATING AN INTEGRATED CIRCUIT

[75] Inventors: Paul C. Lindsey, Jr., Lafayette; Robert J. McClelland, San Ramon, both of Calif.

[73] Assignee: Micro Processing Technology, Inc., Lafayette, Calif.

[21] Appl. No.: 08/639,079

[22] Filed: Apr. 24, 1996

[51] Int. Cl.⁷ ................................................. H01L 21/00
[52] U.S. Cl. ............................ 438/693; 438/690; 216/38
[58] Field of Search .................................... 438/693, 690; 216/38

[56] References Cited

U.S. PATENT DOCUMENTS

| | | | |
|---|---|---|---|
| 3,979,239 | 9/1976 | Walsh | 156/4 |
| 4,128,968 | 12/1978 | Jones | 51/54 |
| 4,144,099 | 3/1979 | Edmonds et al. | 748/33 |
| 4,197,676 | 4/1980 | Sauerland | 51/118 |
| 4,232,485 | 11/1980 | Eadon-Allen | 55/55 |
| 4,244,775 | 1/1981 | D'Asaro | 156/636 |
| 4,358,338 | 11/1982 | Downey et al. | 156/627 |
| 4,403,453 | 9/1983 | Cave et al. | 51/124 R |
| 4,419,848 | 12/1983 | Dischert | 51/229 |
| 4,462,860 | 7/1984 | Szmanda | 156/626 |
| 4,600,469 | 7/1986 | Fusco et al. | 156/636 |
| 4,671,851 | 6/1987 | Beyer et al. | 156/645 |
| 4,693,036 | 9/1987 | Mori | 51/235 |
| 4,789,648 | 12/1988 | Chow et al. | 437/225 |
| 4,793,895 | 12/1988 | Kaanta et al. | 156/627 |
| 4,879,258 | 11/1989 | Fisher | 437/225 |
| 4,956,944 | 9/1990 | Ando et al. | 51/55 |
| 5,104,421 | 4/1992 | Takizawa et al. | 51/295 |
| 5,287,663 | 2/1994 | Pierce et al. | 51/401 |
| 5,508,077 | 4/1996 | Chen et al. | 428/64.3 |
| 5,527,423 | 6/1996 | Neville et al. | 156/636.1 |
| 5,542,874 | 8/1996 | Chikaki | 451/158 |
| 5,547,417 | 8/1996 | Breivogel et al. | 451/58 |
| 5,599,423 | 2/1997 | Parker et al. | 156/636.1 |
| 5,665,201 | 9/1997 | Sahota | 438/693 |
| 5,672,095 | 9/1997 | Morimoto et al. | 451/41 |

FOREIGN PATENT DOCUMENTS

| | | |
|---|---|---|
| 223 920 | 6/1987 | European Pat. Off. . |
| 53-68493 | 6/1978 | Japan . |
| 56-140632 | 11/1981 | Japan . |
| 57-170538 | 10/1982 | Japan . |
| 7-45565 | 2/1995 | Japan . |
| 7-111256 | 4/1995 | Japan . |
| 7-266220 | 10/1995 | Japan . |

*Primary Examiner*—Maria Nuzzolillo
*Assistant Examiner*—Laura Weiner
*Attorney, Agent, or Firm*—Townsend and Townsend and Crew LLP

[57] ABSTRACT

An apparatus 100 for removing surface non-uniformities is provided. This apparatus has a stage 103 for holding a substrate 127 to be processed. This substrate often includes a film thereon, where the film has the non-uniformities. The apparatus 200 includes a movable head 111, which can provide rotatable movement about a fixed axis 123. A drive motor 115 is operably attached to the movable head 111 to provide this rotatable movement. A pad 113 (e.g., polishing or planarizing pad) is attached to the movable head. This pad 113 comprises an abrasive material and also has a smaller length (e.g, diameter, etc.) relative to a length (e.g, diameter, etc.) of the substrate. The smaller pad is capable of selectively removing a portion of the non-uniformities on the film.

19 Claims, 4 Drawing Sheets

METHOD FOR FABRICATING AN INTEGRATED CIRCUIT

BACKGROUND OF THE INVENTION

The present invention relates to the manufacture of semiconductor integrated circuits. More particularly, the invention provides a technique including a method and apparatus for integrated circuit fabrication using an improved chemical-mechanical planarization or polishing (CMP) technique. But it will be recognized that the invention has a wider range of applicability; it can also be applied to the manufacture of flat panel displays, optical devices, electro-optical devices, and others.

In the manufacture of semiconductor integrated circuits, device geometries are becoming increasingly smaller. These smaller device geometries tend to cause a variety of problems during the manufacture of such circuits, especially for multi-metal layered devices. One of these problems is the contact via alignment between an upper conductive layer and a lower conductive layer. The contact alignment problem between these conductive layers is often caused by a non-uniform inter-dielectric layer therebetween. The non-uniform inter-dielectric layer is often characterized by peaks and valleys defined in the layer surface.

These peaks and valleys on the dielectric layer have also caused other limitations. In particular, an overlying metal layer would generally follow the topography of the underlying layer (i.e., dielectric layer), which is defined by peaks and valleys. Patterning this metal layer now having peaks and valleys is often difficult because of conventional lithography's depth-of-focus limitation. That is, different areas on the dielectric layer having different heights cause an overlying metal layer also having different heights, leading to improper focussing. Furthermore, even if the metal layer was deposited accurately overlying the dielectric layer, it would often be thinner at step edges, thereby leading to failure caused by problems such as thermal stress, metal fatigue, electro-migration, etc. Techniques have been proposed to reduce these layer non-uniformities.

One technique is the so-called photoresist etchback (REB) process. This photoresist etchback process uses the steps of applying a relatively non-viscous layer of photoresist overlying the surface having non-uniformities. The photoresist is developed leaving a relatively uniform layer of photoresist overlying the surface. An etching step removes horizontal portions of the photoresist and surface non-uniformities at about the same rate. Thus, the etching step reduces the height of peaks in the layer, thereby taking some of the non-uniformity out.

The REB process, however, has limitations. In fact, it consumes expensive fabrication chemicals such as photoresist and etchants, which add costs to the circuit. The process also uses valuable production time from both photoresist and etching equipment, which influences wafer turn-around-time. Photoresist also tends to introduce even more particulate contamination onto the circuits. Accordingly, the REB process has severe limitations in the manufacture of today's sub-micron sized devices.

Another technique is chemical-mechanical polishing or planarization, commonly termed CMP. CMP generally relies upon an apparatus 5 comprising a large rotating pad impregnated with an abrasive material, as illustrated by the simplified top-view diagram of FIG. 1. This apparatus includes a base plate 10. A circular rotating polishing pad 13 is mounted on the base 10. The pad 13 is rotated or spun by a driving motor (not shown), often located in the base 10. A chuck assembly 15 holds a semiconductor wafer 17, which is placed facedown on the rotating pad 13. As can be seen, the rotating pad has a diameter that is generally much larger than the diameter of the semiconductor wafer 17, thereby providing global planarization of the substrate.

A selected force is applied to the backside of the substrate to compress the face of the substrate against the rotating pad. The combination of the rotating pad, abrasive material, and selected force removes or polishes the surface non-uniformities from the face. The rotating pad has a diameter, often much larger than the diameter of the substrate. This large diameter pad can be quite effective in globally removing non-uniformities from surfaces of bulk materials, e.g., flat glass, semiconductor substrates, etc.

This large pad, however, often cannot remove local variations that may exist on a film (e.g., dielectric, metal, silicon, etc.) overlying the semiconductor wafer. As wafer sizes become larger (e.g., 8 inch, 12 inch, and greater), it is often difficult to remove the non-uniformities in the film overlying the wafer due to these local variations. The large pad also has local variations in itself, thereby causing further complications in processing the film on these wafers. These local variations on the pad can be spatial differences in pad thickness and spatial differences in the amount of abrasive materials. These variations of the abrasive material can lead to different chemical etching rates, which often cause even more processing complexities.

As device sizes become smaller, the large pad also can be a source for particulate contamination. Specifically, the large pad attracts particulate contamination from the environment and the wafer itself. The contamination accumulates on the pad, and can deposit onto the wafer, which may cause functional and reliability problems with the integrated circuits. The large pad also requires a massive machine, which occupies a large area of a fabrication plant, e.g. a large footprint. The large pad also rotates slowly and often cannot provide a great deal of pressure on the surface of today's larger semiconductor wafers (e.g., 6 inch, 8inch, 12 inch, etc.), thereby increasing process times. Accordingly, the conventional CMP technique has a variety of limitations in processing today's submicron sized devices.

From the above, it is seen that a technique for forming uniform layers of film materials during the manufacture of integrated circuits is often desirable.

SUMMARY OF THE INVENTION

According to the present invention, a technique including a method and apparatus for removing surface non-uniformities on a film is provided. This technique uses a smaller diameter, high-speed, polishing pad to remove portions of these surface non-uniformities.

In one aspect of the invention, an apparatus for removing surface non-uniformities is provided. This apparatus has a stage for holding a substrate to be processed. This substrate often includes a film thereon, where the film has the non-uniformities. The apparatus includes a movable head, which can provide rotatable movement about a fixed axis. A drive motor is operably attached to the movable head to provide this rotatable movement. A pad (e.g., polishing or planarizing pad) is attached to the movable head. This pad comprises an abrasive material and also has a smaller length (e.g, diameter, etc.) relative to a length (e.g, diameter, etc.) of the substrate. The smaller pad is capable of selectively removing a portion of the non-uniformities on the film.

Another aspect of the invention provides a method for fabricating an integrated circuit. This method includes providing a semiconductor wafer having a film thereon, where the film has surface non-uniformities. The method then rotates a pad comprising abrasive material and selectively applies this rotating pad against the film. This applying step occurs using a selected force to remove a portion of the surface non-uniformities. This pad has a substantially smaller diameter than a diameter of the semiconductor wafer.

The present invention achieves these benefits in the context of known process technology. However, a further understanding of the nature and advantages of the present invention may be realized by reference to the latter portions of the specification and attached drawings.

DESCRIPTION OF THE SPECIFIC EMBODIMENT

Figure 1:
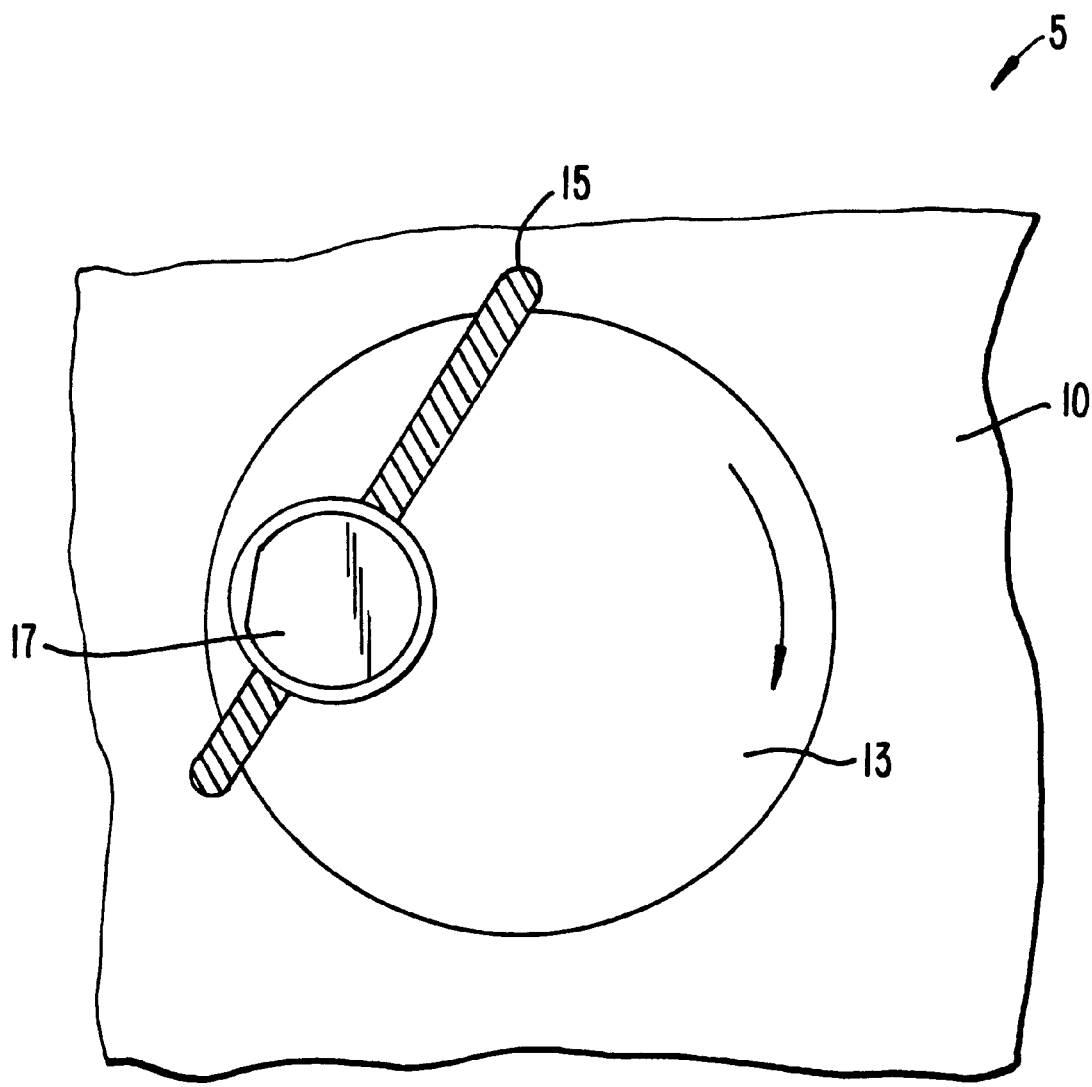
FIG. 1 is a simplified diagram of a conventional CMP apparatus.
Figure 2:
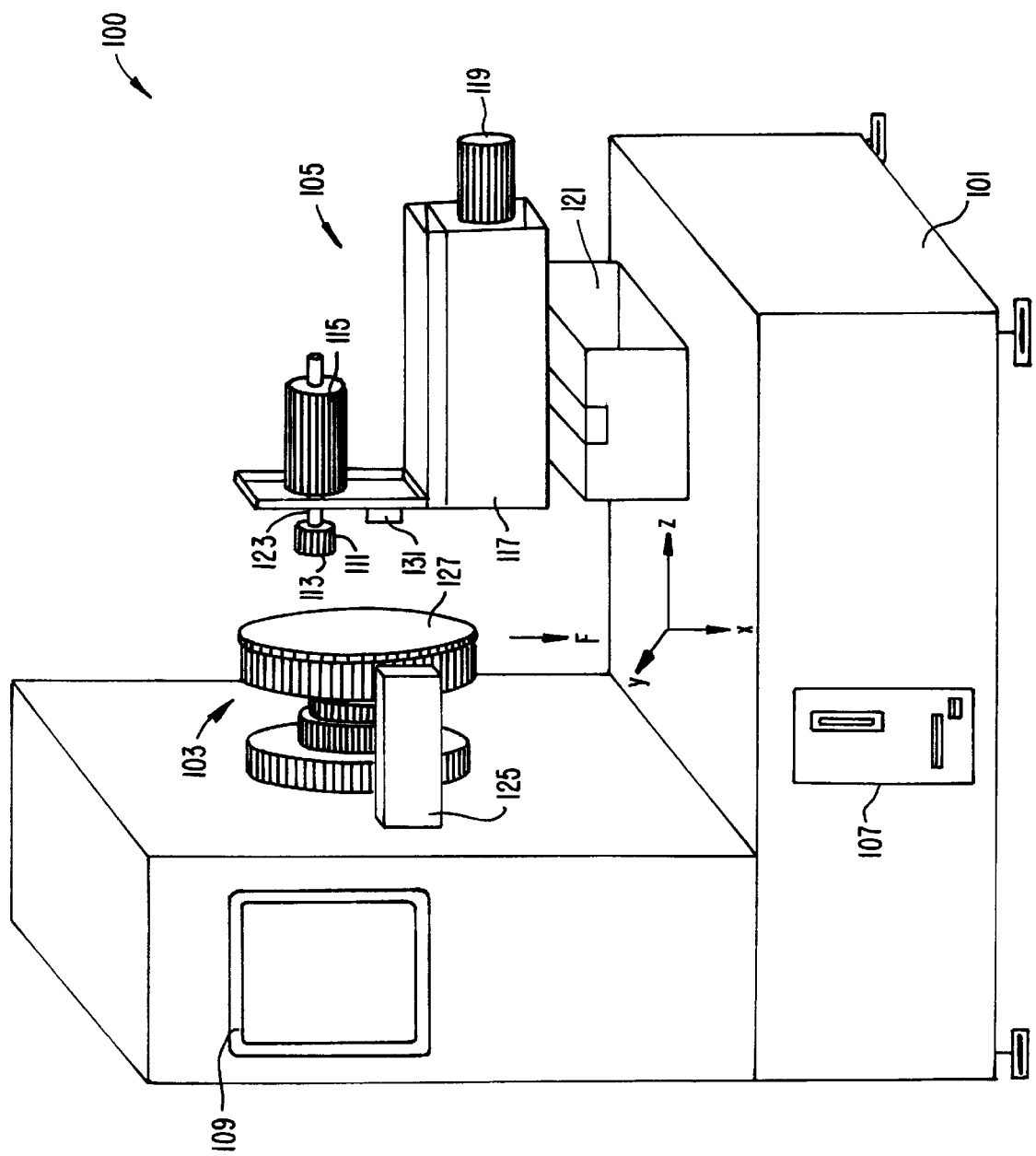
FIG. 2 is a simplified diagram of a CMP apparatus according to the present invention.

FIG. 2 is a simplified diagram of a CMP apparatus according to the present invention. This CMP apparatus is merely an illustration and should not limit the scope of the claims as defined herein. One of ordinary skill in the art would recognize other modifications, alternatives, and variations to the claims.

The CMP apparatus 100 includes a variety of elements for providing the present technique. None of these elements should be construed as limiting the scope of the claims defined herein. These elements include a machine housing 101, a work-piece stage 103 (e.g., wafer stage, etc.), a head assembly 105, a controller 107, a video monitor 109, a force application device 119, a pad conditioning device 125, and other elements. Optionally, the apparatus may also include elements such as a cassette holder, a robotic arm, a process monitor, among others.

The head assembly 105 has elements used to apply a small rotatable head over the substrate (e.g., semiconductor wafer, ceramic substrate, metal substrate, glass, etc.) to be polished or planarized. The head assembly 105 includes a polishing or planarization head 111. This polishing head 111 has a polishing pad 113, used to polish selected portions of the substrate or used to polish selected portions of a film on the substrate.

The polishing pad is a rotatable disk, but can also be defined by other shapes. In one embodiment, the polishing pad is a relatively compliant rotatable disk to allow the pad to conform to any gross variations (e.g., about 100 $\mu$m and less) in the substrate surfaces or film deposited on the substrate. Preferably, the polishing pad is a multilayered pad comprising a backing material with an overlying pad material. Alternatively, the pad may be relatively stiff to remove any higher non-uniformities on the substrate surfaces. This relatively stiff pad includes a stiffer backing material than the compliant pad. The pad can be made from synthetic material such as polyurethane, polyester, nylon, rayon, and other polymeric materials, or from natural materials such as wool, cotton, silk or other fibers.

The pad can be manufactured with embedded abrasive particles disposed homogeneously therethrough, or with abrasive particles spread evenly overlying the pad surface. In particular, the amount of abrasive particles or the density of abrasive particles in the pad is relatively consistent or homogeneous throughout the pad material. Alternatively, only the top surface of the pad material has abrasive particles that attached themselves thereon.

The abrasive has a selected grit size to reduce "high spots" on a film (or substrate surface) used in semiconductor manufacturing. The grit ranges in nominal size from about 0.001 to about 10 $\mu$m. Preferably, the grit size ranges from about 0.01 to about 1.0 $\mu$m. This grit can be made from any suitable material such as alumina, silicon dioxide, diamond, silicon carbide, and other materials.

Preferably, the pad is circular or disk-shaped and has a relatively smaller diameter (or length) than the diameter of the substrate. This smaller pad can be moved from one location of the substrate to another to provide selective polishing of the substrate surface. That is, the smaller pad can polish or planarize local non-uniformities. The smaller pad also has less local variations than conventional pads, which are often much larger than the substrate. The pad has a size ranging from about 0.1 inch to about half the diameter of the substrate, in most cases. Preferably, the pad diameter ranges from about 0.25 to about 1.5 inches. The pad also can be rotated at speeds ranging from about 1,000 to about 100,000 RPM. This tends to increase the rate of material removal.

In other embodiments, the pad can selectively apply fluid to itself and/or the substrate. In one embodiment, the pad has an opening in its center, which provides an orifice for fluid flow. Alternatively, the pad is porous, providing for a selective distribution of fluid therethrough. The pad may also have multiple openings distributed spatially. Each of these openings is an orifice for fluid flow. In any of the above embodiments, the fluid can be selected from a lubricant, a cleaner (e.g, surfactant, acid, etc.), a non-reactive solution (e.g, water, etc.), a slurry comprising a carrier fluid and abrasive particles, a chemically reactive solution with or without abrasive particles, combination thereof, and others.

In alternative embodiments, fluid can be applied using a separate fluid distribution system. This fluid distribution is located adjacent to the polishing head. Fluid may be selectively controlled through a control valve, which monitors the amount of fluid dispensed onto the substrate through a piping structure. This piping structure is operably coupled to a fluid source at one end and has an opening at the other end to allow fluid to dispense therethrough. The opening can be fitted by a nozzle such as a spray nozzle, a shower head, and others. Of course, the type of fluid distribution can depend upon the application.

The polishing head 111 is attached via a drive shaft 123 to a drive motor 115. As shown, the drive shaft attaches the polishing head to the drive motor. In some embodiments, the drive shaft is a tube or pipe, which can transfer a fluid (e.g., lubrication, slurry, cleaner, rinse, etc.) therethrough. Specifically, one end of the drive shaft is operably coupled to a fluid source, which can selectively dispense fluid into the shaft. The other end of the drive shaft is operably coupled to the pad, which has an opening for dispensing the fluid onto itself or the surface of the substrate. The drive shaft can also include an opening for providing a vacuum or a suction to hold the pad firmly in place. Other types of attachment means also may be used. Of course, the type of attachment means will depend upon the application.

The drive motor 115 is coupled to the polishing head 111 via the drive shaft 123. Other types of attachment means (e.g., chains, belts, gears, etc.) also may be used. The drive motor 115 can be any suitable motor for rotating the polishing head at speeds high enough to polish or planarize the substrate surface or film. An example of this motor is a stepper motor, a servo motor, a fluid-drive motor, or any other motor. This drive motor is capable of operating a speeds ranging from about 1,000 to about 100,000 RPM, but is preferably about 5,000 to about 20,000 RPM. These speeds tend to enhance the removal rate of substrate material or film material. The motor can be adjusted to operate at any speed in the above range during a selected time in the process. The motor also has a power rating of greater than about 10 Watts to drive the polishing head. The motor should have enough power to provide a relatively constant rotation speed at a selected force to the substrate surface during polishing.

The selected force is provided by the force application device 119, also located on the head assembly 105. In this device, the force is applied by way of springs, pneumatics, magnetics, or any other means. The device allows the pad to have an applied force ranging from about 0.01 to about 100 lbs-force or preferably about 0.5 to about 10 lbs-force on the substrate surface. The combination of this force and the smaller pad can provide a relatively high degree of pressure on the substrate or film surface, which enhances the rate of material removal. The force can be relatively constant or can be varied depending on the application. In one embodiment, the force is varied depending upon the processing progress.

To move the polishing head 111 to selected locations on the substrate, the drive motor 115 is operably mounted via motor z-stage 117 to a stage assembly 121. The combination of the motor z-stage and stage provide x-y-z movement to the drive motor and the polishing head. These stages are driven using servo drivers, stepper motors, pneumatics, hydraulics, piezo electronics, etc. The accuracy of the stage in the x-y direction ranges from about 0.1 to about 100 μm.

The accuracy of the stage in the z-direction ranges from about 0.001 to about 10 μm. The stage may move the polishing head in a continuous motion, a stepping motion, or any other motion. Alternatively, these elements may also provide movement in polar or cylindrical coordinates depending upon the application.

Optionally, the CMP apparatus includes the pad conditioning device 125. As shown, the device is located near the stage and within range of the polishing head. Of course, other locations may be used depending upon the application. The conditioning device can perform many maintenance related functions with respect to this apparatus, and in particular the pad. In one embodiment, the conditioning device conditions the polishing pad by removing any asperities or high points from the abrasive particles on the pad or by removing loose abrasive particles from the pad, thereby preventing any potential wafer damage, e.g., scratches, gouges, particulate contamination, etc.

The pad conditioning device can be a smooth or textured surface of a hard material such as diamond, silicon carbide, etc. mounted on the top surface of a platform. It can also be a brush made of plastic or metal bristles rotating or stationary at the conditioning site. The pad conditioning device may also be single or multiple jets of fluid, such as water or air, impinging on the pad at the conditioning site. The conditioning device also may perform other functions.

In other embodiments, the head assembly may comprise multiple polishing (or planarization) heads. Each polishing head can be attached to a drive shaft, being operated by a single or multiple drive motors. Each polishing head may have a similar size or different size. These polishing heads can be operated at the same speed or different speeds. The type of polishing pad used on each head may also be similar or different. Of course, the exact configuration of these polishing heads will depend upon the application.

The stage 103 firmly holds a substrate 127, e.g., wafer, glass plate, metal plate, etc. The stage 103 can be any suitable stage or chuck, which can firmly hold this substrate. An example of this stage is a vacuum chuck, an electrostatic chuck, or mechanical clamping chuck, and others. This chuck firmly holds the substrate to prevent any substantial movement thereof. As shown, the stage holds the substrate in a direction where the face is perpendicular to the wafer fab floor. This directed substrate tends to allow fluid to flow off the substrate via gravity. Of course, the type of stage used depends upon the application.

In other embodiments, the stage can be fixed or movable. In one embodiment, the stage is a fixed wafer stage. That is, it does not substantially move the substrate, relative to the polishing head. Alternatively, the stage is movable, relative to the polishing head. This movable stage can operate relative to the polishing head in the x-y-z directions. Alternatively, the movable stage also can operate relative to the polishing head in the polar or cylindrical coordinates. The movable stage operates in a low speed and high speed mode. It can also step the wafer from one location to another or provide for scanning features. In other embodiments, the stage can be rotated relative to the head. The rotation speed is 10 to about 10,000 RPM, and is preferably about 500 to about 5,000 RPM. This rotation can occur through an air bearing assembly. Of course, the exact speed of this stage often depends on the application. The stage also can have additional features, depending upon the application.

In preferred embodiments, the apparatus includes a sensor 131 (e.g., an end-point detection probe) to monitor the amount of material removal. The sensor 131 is operably coupled to the controller 107. This sensor detects the local thickness of, for example, a dielectric layer that is being removed by the polishing head. As merely an example, this sensor is provided by a motor current sensor, scattered light beam sensor, acoustic sensor, electromagnetic sensor, capacitance sensor, and others. Once a desired thickness is achieved, the polishing head can be moved to another location for material removal. This sensor can continuously send signals to the controller, which can determine the thickness of dielectric layer at almost anytime during the process. Alternatively, the sensor may send signals to the controller intermittently at selected locations of the substrate surface.

Accordingly, the sensor provides for an in-situ thickness measurement technique or an in-situ technique for monitoring the material removal rate. This sensor can monitor the rate of material removal in-situ (or thickness of the material) because the present invention uses a relatively small polishing head, which allows for other elements (e.g., sensors, etc.) to be disposed adjacent to it. By way of the small polishing head, large portions of the top surface of the substrate are exposed for viewing via the sensor or camera or operator using the apparatus of this present invention. Real time control is achieved using this sensor and the arrangement of this present invention.

The present CMP apparatus can be used to remove or reduce surface non-uniformities from a variety of surfaces. These surfaces include those from substrates, e.g., semiconductor substrates, glass for flat panel displays, glass or metal for optical components, and others. Non-uniformities also can be reduced or removed from films made overlying these substrates. These films include silicon dioxide, silicon nitride, metal (e.g., platinum, aluminum, tungsten, titanium, copper, etc.), polysilicon, doped silicon dioxide, tin oxide, indium tin oxide, and the like. The CMP apparatus also can have many other uses.

A method according to the present invention may be briefly outlined as follows:

(1) Provide a cassette of partially completed semiconductor substrates.
(2) Place a semiconductor substrate having a film on a wafer stage.
(3) Secure semiconductor substrate.
(4) Condition polishing pad.
(5) Rotate polishing pad.
(6) Apply polishing pad with force onto the film.
(7) Move polishing pad to selected regions of the film.
(8) Begin removing local non-uniformities in the film.
(9) Add lubricating fluid to polishing pad.
(10) Monitor planarity.
(11) Sense end-point.
(12) Clean wafer.
(13) Remove wafer and return to cassette.
(14) Perform remaining process steps.

Figure 3:
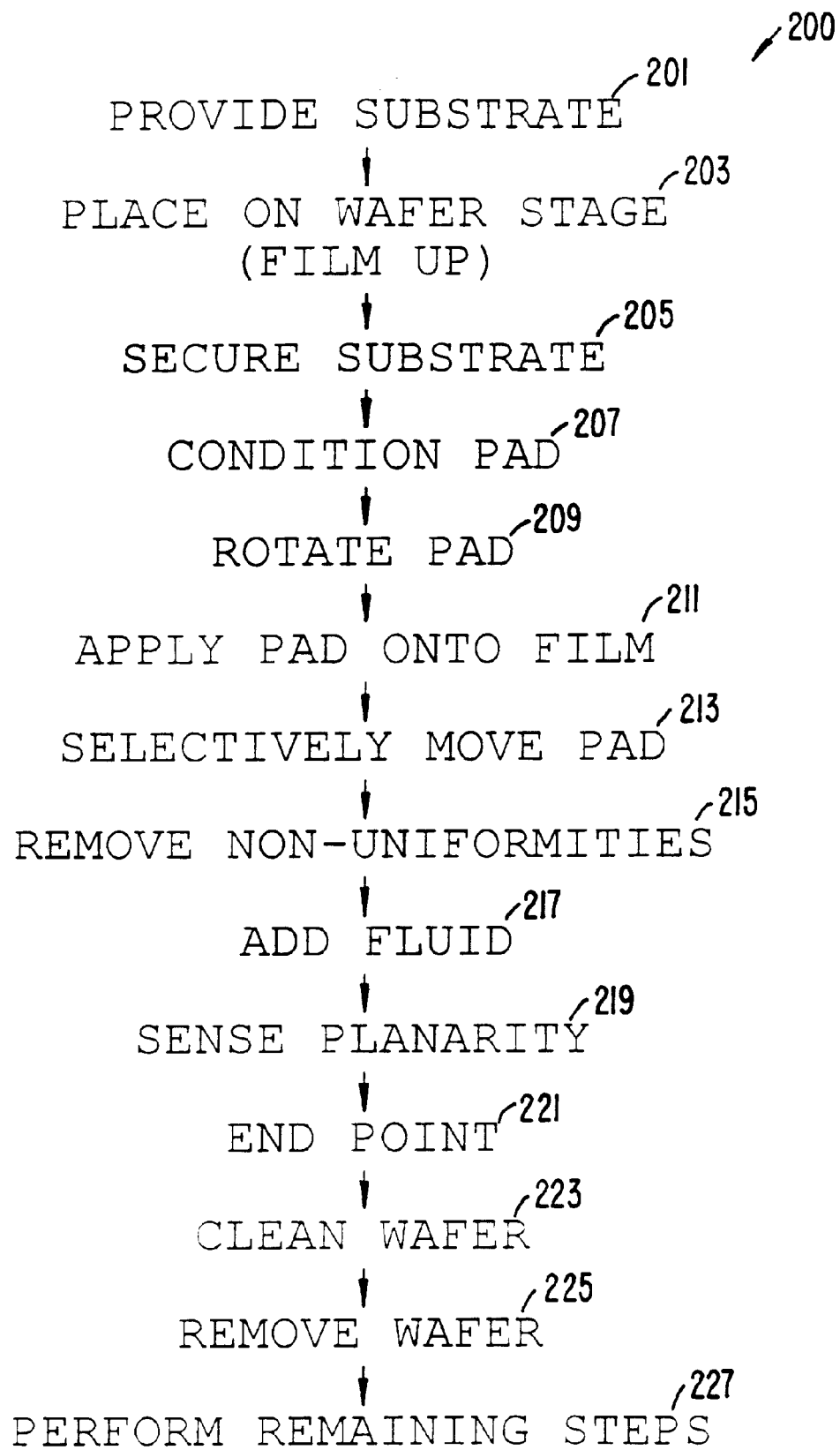
FIG. 3 is a simplified flow diagram illustrating a method used by the CMP apparatus of FIG. 2.

As can be seen, these steps remove local non-uniformities from a film overlying a semiconductor substrate. The non-uniformities are removed by way of a polishing pad that is smaller in diameter than the substrate. This smaller pad can be moved to selected locations of the wafer. The above steps are shown as merely an example, and should not limit the scope of the claims as defined herein. One of ordinary skill in the art would use other modifications, alternatives, and variations. Details of this method can be described in more detail by way of the flow diagram 200 of FIG. 3.

The method begins by providing a semiconductor wafer (step 201) having an overlying film. This film is characterized by a variety of surface nonuniformities, e.g., peaks, valleys, high spots, trenches, etc. In most embodiments, the wafer is removed from a wafer cassette by way of a robotic arm of a handling means and placed on a stage (step 203). Alternatively, an operator may manually place the wafer onto the stage. This wafer is generally placed face-up on the stage. The wafer is secured (step 205) on the wafer stage by a vacuum chuck, by an electrostatic chuck, by mechanical clamping or by other means.

In one embodiment, the polishing pad is conditioned (step 207) before contacting it to the film overlying the wafer. In particular, the head assembly moves the polishing head to the conditioning site. The surface of the pad contacts the conditioning device. This pad is now rotated via drive motor. Alternatively, the pad is rotated and remains in the rotation state before contacting it to the conditioning device. The conditioning device substantially removes asperities or high points from the abrasive particles on the pad removes loose particles from the surface of the pad, or textures the surface of the pad. Accordingly, the conditioning device cleans (or conditions) the pad before wafer processing or at intervals during the wafer processing.

The polishing pad via head assembly moves from the conditioning device to the wafer surface. In most embodiments, the polishing pad is rotated (step 209) and remains in the rotation state. In this rotation state, the polishing pad is pressed in contact with the film surface (step 211) overlying the wafer, applying force between the polishing pad and the wafer surface. The force is provided and regulated by the force application device, e.g., pneumatic cylinder, spring, etc.

The force is selectively adjusted to remove desired portions of the high points or non-uniformities (step 215). As merely an example, the force may be relatively low at the beginning of the process to prevent portions of the film material from breaking off, higher during the middle part of the process to increase material removal rate and throughput, and low again at the end of the process to reduce surface damage and to increase control of the removal process.

In generally all embodiments, the head assembly selectively moves the pad from location-to-location (step 213) on the film surface of the wafer to remove local non-uniformities therefrom. In one embodiment, the head assembly scans the rotating pad across the wafer in a selected pattern or path. The pattern can be longitudinal across a line of dice or traverse the surface of the dice at an angle relative to a line of dice or a combination of both. Alternatively, the head assembly can step the rotating pad from one location to another removing local variations in the film. In a further alternative embodiment, the head assembly moves the rotating pad circularly along lines of dice.

In other embodiments, the stage moves the wafer (rotationally or in an x-y direction) at the same time that the rotating pad moves across the film surface. Alternatively, the stage moves the wafer and the rotating pad is maintained at a fixed location. A further embodiment provides a combination of a moving or fixed stage and a movable or fixed rotating pad. Of course, other modifications to these embodiments can be made depending upon the application. In all of these embodiments, however, the rotation speed of the moving pad, the speed of the moving stage, and head assembly path are selected to provide a controllable film thickness change and/or controllable material removal rate at each point on the film surface.

In further embodiments, a fluid (e.g., lubrication, slurry, cleaner, water, etc.) is injected (step 217) into an area between the polishing pad and the film. In one embodiment, the fluid is injected through an opening in the shaft of the motor. The fluid also can be applied or injected into the pad or onto the film using a variety of other techniques. The fluid can be used to lubricate the pad. Alternatively, the fluid can be a processing chemical, e.g., etchant, slurry, etc., used on the film. The fluid also can clean the film or remove particles from the film. Of course, the type of fluid depends upon the application.

The rotating pad is applied to the film until an endpoint (step 221) is detected. The endpoint is often characterized by a film that is substantially uniform for subsequent processing. In one embodiment, a sensor (e.g., motor current sensor, scattered light beam sensor, capacitance sensor, etc.) monitors (step 219) the surface of the film during processing to determine the progress that is being made in the process. This monitoring sensor may be used to determine when the entire surface of the wafer is substantially planarized or it may be used to detect regions of the surface where the planarization is not complete so that the polishing pad may be applied selectively in these areas. The sensor may monitor the surface of the wafer continuously, following the movement of the polishing head, or it may be used intermittently to sample only selected points on the wafer surface. The sensor via controller can use a fixed "recipe" or feed-back control mechanism. The process time from steps 209 to 221 ranges from about 1 second to about 10 minutes. Preferably, the time should be between about 15 seconds to about 2 minutes for effective wafer turn around.

The substantially planarized surface allows for the effective formation of subsequent overlying layers. In particular, this surface can be substantially uniform (e.g., 1% variance or less) using a conventional uniformity measurement system. Alternatively, the surface can have small height variations oscillating about some average value, as shown by FIG. 4.

Figure 4:
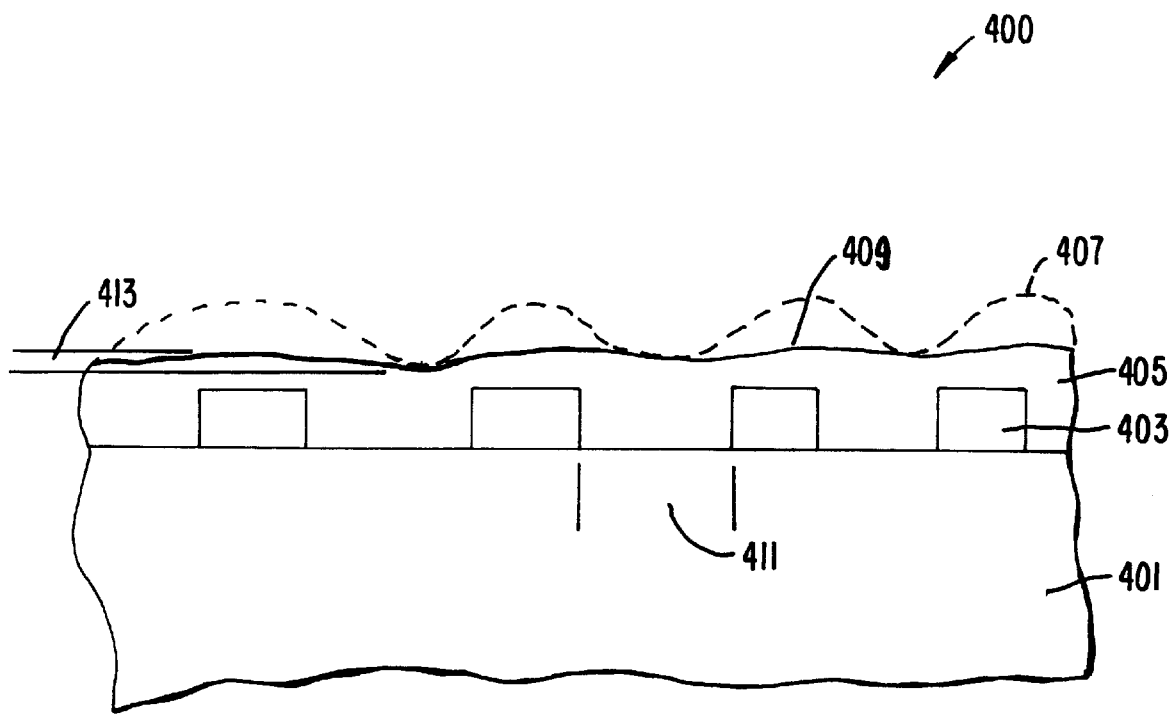
FIG. 4 is a simplified cross-sectional view diagram of a device made according to the present invention.

FIG. 4 is a simplified cross-sectional view diagram of a device 400, according to this embodiment. The device includes a semiconductor substrate 401, a patterned metal layer 403, and an overlying dielectric layer 405. As shown, the dotted line 407 represents the location of the dielectric layer before planarization, which is often characterized by peaks and valleys. The planarized or polished dielectric layer 405 is illustrated having small height variations 413 defined along its surface 409. The small height variations 413 on the surface 409 can still produce acceptable results. That is, it is not completely necessary to form a substantially uniform layer in some embodiments. In these embodiments, subsequent steps such as metallization and photolithography can still be performed effectively.

After detecting the endpoint, the wafer can be cleaned (step 223) using an in-situ cleaning process. The in-situ cleaning process can use a variety of cleaning devices such as, for example, brushes (e.g., plastic, etc.), sprays of cleaning chemicals, sprays of deionized water, or others. This cleaning process can also be carried out concurrently with the polishing or planarization process. After cleaning, the wafer can be dried using convection, conduction, radiation, or a combination thereof. In one embodiment, drying gases are flowed using a distribution system overlying the wafer. These drying gases can be any relatively non-reactive gas such as nitrogen, or any other inert gas.

The wafer is released (step 225) from the wafer stage and is returned to the wafer cassette manually by an operator or automatically by a robotic arm. The wafer is now ready for subsequent processing (step 227). These subsequent processes may include additional cleaning, metallization, diffusion, etching, deposition, and others. Of course, the above sequence of steps are merely an illustration of a technique used by the present invention.

Optionally, a technique for replacing the polishing pad is included. In one embodiment, the polishing pad can be used for several wafers. Alternatively, the polishing pad is replaced after processing a single wafer or while processing a single wafer. Pads with the same or different properties may be used on a single wafer. By replacing the polishing pad every wafer or every few wafers, the pad does not accumulates a large quantity of impurities from the process, thereby providing a relatively clean process. Of course, this depends upon the type of pad and film being planarized.

Operations of the present CMP apparatus and method are controlled using the controller. This controller can be a microprocessor control means such as a PC, a work station, a programmable logic controller, etc. Sensors operably connected to the controller provide signals to and from the apparatus elements to carry out the present technique. This controller greatly eases the burden of operating this apparatus, where a typical operator can monitor more than one and preferably a group of these machines for production efficiency. In most embodiments, an operator can view, monitor, and control the process using a standard keyboard and the monitor.

Benefits of the present invention occur by way of the smaller polishing head. In particular, the smaller polishing head via its smaller size provides higher material removal rates, e.g., polishing or planarization. Higher material removal rates are achieved by the faster rotation speeds of the smaller head and the greater pressures, which can be applied to the film or substrate surface. In fact, this present technique may provide process times that are substantially less (e.g., ten times or more) than conventional techniques.

The present apparatus is also considerably smaller in size than conventional CMP apparatus and therefore occupies a smaller floor space (or footprint) in the fabrication facility. Consumable chemical costs are greatly reduced or even eliminated. In fact, the smaller polishing head with its smaller pad uses most of the abrasive material (e.g., slurry, etc.) for polishing, rather than accumulating this material in the thick pad of conventional CMP apparatus. Process monitoring can occur in-situ via the small polishing head and exposed portions of the substrate surface. The present technique can also be applied to larger wafers (e.g., 8 inch, 12 inch, etc.), without significant modification to the apparatus. Also with use of the small polishing head, in-situ cleaning can take place in this present technique. One of ordinary skill in the art would also recognize other benefits using this present technique.

While the above is a full description of the specific embodiments, various modifications, alternative constructions and equivalents may be used. For example, while the description above is in terms of polishing apparatus and method for semiconductor wafers, it would be possible to implement the present invention with a flat panel display, glass substrate, or the like. The embodiments shown may comprise, for example, a single polishing head embodiment. Alternatively, multiple polishing heads can be used. Therefore, the above description and illustrations should not be taken as limiting the scope of the present invention which is defined by the appended claims.

What is claimed is:

1. A method for fabricating an integrated circuit, said method comprising:

providing a semiconductor wafer having a film thereon, said film having a surface that is non-uniform;

providing a pad comprising abrasive material, said pad defining an opening configured to be an orifice for fluid flow; and rotating said pad and applying said pad against said film, said applying occurring at a selected force to remove a portion of said surface where said surface is non-uniform;

wherein said pad has a substantially smaller diameter than a diameter of said semiconductor wafer.

2. The method of claim 1 wherein said selected force ranges from about 0.5 to about 10 lbs-force.

3. The method of claim 1 wherein said film is selected from a group consisting of a dielectric material, a metal, and a semiconductor material.

4. The method of claim 1 wherein said pad is rotated at a speed ranging from about 100 to about 100,000 RPM.

5. The method of claim 1 wherein said pad is rotated at a speed ranging from about 500 to about 20,000 RPM.

6. The method of claim 1 wherein the diameter of said pad ranges from about 0.1 inch to about one-half the diameter of said semiconductor wafer.

7. The method of claim 6 wherein the diameter of said semiconductor wafer is about 3 inches.

8. The method of claim 1 wherein said pad is multilayered.

9. The method of claim 1 wherein said pad comprises an abrasive material overlying a compliant backing material.

10. The method of claim 1 wherein said pad comprises an abrasive material overlying a non-compliant backing material.

11. The method of claim 1 wherein said abrasive material is provided with a diameter ranging from about 0.001 to about 10 µm.

12. The method of claim 1 wherein rotating said pad further includes rotating a plurality of pads wherein said plurality of pads have a substantially smaller diameter than said diameter of said semiconductor wafer.

13. The method claim 1 wherein said pad defines a plurality of openings distributed spatially.

14. The method of claim 1 further including conditioning said pad.

15. The method of claim 1 wherein a face of said semiconductor wafer is maintained substantially perpendicular to the ground at a semiconductor fabrication plant to permit fluid to flow off said semiconductor wafer via gravity.

16. The method of claim 1 further including injecting a fluid into an area between said pad and said semiconductor wafer.

17. The method of claim 16 wherein said fluid is selected from a group comprising lubricant, slurry, cleaner, and water.

18. A method of fabricating an integrated circuit, said method comprising:

provides a semiconductor wafer having a film thereon, said film having a surface that is non-uniform;

providing a pad comprising abrasive material, said pad defining an opening configured to be an orifice for fluid flow, said pad having a substantially smaller diameter than a diameter of said semiconductor wafer;

rotating said pad and applying said pad against said film, said applying occurring at a selected force to remove a portion of said surface where said surface is non-uniform; and conditioning said pad.

19. A method of fabricating an integrated circuit, said method comprising:

providing a semiconductor wafer having a film thereon, said film having a surface that is non-uniform;

providing a pad comprising abrasive material, said pad defining an opening configured to be an orifice for fluid flow, said pad having a substantially smaller diameter than a diameter of said semiconductor wafer;

rotating said pad and applying said pad against said film, said applying occurring at a selected force to remove a portion of said surface where said surface is non-uniform; and maintaining a face of said semiconductor wafer substantially perpendicular to the ground at a semiconductor fabrication plant to permit fluid to flow off said semiconductor wafer via gravity.

* * * * *